(12) United States Patent
Knierim et al.

(10) Patent No.: US 7,071,787 B2
(45) Date of Patent: Jul. 4, 2006

(54) METHOD AND APPARATUS FOR THE REDUCTION OF PHASE NOISE

(75) Inventors: Daniel G. Knierim, Beaverton, OR (US); David L. Knierim, Wilsonville, OR (US)

(73) Assignee: Tektronix, Inc., Beaverton, OR (US)

( * ) Notice: Subject to any disclaimer, the term of this patent is extended or adjusted under 35 U.S.C. 154(b) by 108 days.

(21) Appl. No.: 10/713,468

(22) Filed: Nov. 14, 2003

(65) Prior Publication Data
US 2004/0145420 A1 Jul. 29, 2004

Related U.S. Application Data

(60) Provisional application No. 60/428,496, filed on Nov. 22, 2002.

(51) Int. Cl.
*H03L 7/197* (2006.01)

(52) U.S. Cl. ............... 331/1 A; 327/147; 327/156; 375/376

(58) Field of Classification Search .......... 331/16, 331/18, 25, 1 A, 1 R, DIG. 2; 327/47, 115, 327/117, 147, 156, 167, 291; 375/373, 375, 375/376; 377/48
See application file for complete search history.

(56) References Cited

U.S. PATENT DOCUMENTS

| | | | | |
|---|---|---|---|---|
| 4,179,670 A * | 12/1979 | Kingsbury | ................ | 331/10 |
| 4,816,774 A * | 3/1989 | Martin | ................ | 331/1 A |
| 4,965,531 A * | 10/1990 | Riley | ................ | 331/1 A |
| 5,038,117 A * | 8/1991 | Miller | ................ | 331/16 |
| 5,055,802 A * | 10/1991 | Hietala et al. | ................ | 331/16 |
| 5,517,534 A | 5/1996 | Knierim | | |
| 5,563,535 A * | 10/1996 | Corry et al. | ................ | 327/105 |
| 5,576,666 A * | 11/1996 | Rauvola | ................ | 331/25 |
| 6,008,704 A * | 12/1999 | Opsahl et al. | ................ | 332/127 |
| 6,219,397 B1 * | 4/2001 | Park | ................ | 375/376 |
| 6,236,275 B1 * | 5/2001 | Dent | ................ | 331/1 A |
| 6,556,086 B1 * | 4/2003 | Keaveney et al. | ................ | 331/1 A |
| 6,670,854 B1 * | 12/2003 | Takeda et al. | ................ | 331/1 A |
| 6,707,855 B1 * | 3/2004 | Patana | ................ | 375/244 |
| 6,844,836 B1 * | 1/2005 | Lee | ................ | 341/143 |

* cited by examiner

*Primary Examiner*—Timothy P. Callahan
*Assistant Examiner*—Hai L. Nguyen
(74) *Attorney, Agent, or Firm*—Thomas F. Lenihan

(57) ABSTRACT

A phase locked loop type frequency synthesizer utilizing a reference signal source includes a voltage controlled oscillator (VCO), a phase comparator, a programmable pre-scaler and a modulator. The programmable pre-scaler divides the output of the VCO according to a sequence of divide ratios to produce a divided signal having a frequency approximating the reference signal frequency. The phase comparator compares the phases of the divided signal and the reference signal and, in response to a difference, adapts the VCO to reduce the detected difference. The modulator provides a next value in the sequence of divide ratios by accumulating an error between a present value and an average value in the sequence of divide ratios, accumulating the accumulated error values, and determining the next value in the sequence of divide ratios such that the multiply-accumulated error values are maintained within finite bounds.

27 Claims, 5 Drawing Sheets

METHOD AND APPARATUS FOR THE REDUCTION OF PHASE NOISE

CROSS REFERENCE TO RELATED APPLICATIONS

This application claims the benefit of U.S. Provisional Application No. 60/428,496, filed Nov. 22, 2002, which is incorporated herein by reference in its entirety.

FIELD OF THE INVENTION

The invention relates generally to fractional-N frequency synthesizers and, more specifically, to the operation of fractional-N frequency synthesizers at high speeds while maintaining flexibility in the programming of the fractional value.

BACKGROUND OF THE INVENTION

A conventional way to lock a f*N voltage controlled oscillator (VCO) to an f*M frequency reference, where N and M are integers and f is a common frequency component, is to divide the two frequency signals by the integers N and M, respectively, and to phase lock the resulting "f" frequency outputs together. If N and M are large, however, this approach may not provide sufficient loop bandwidth to overcome phase noise in the VCO.

One prior art method of addressing this loop bandwidth problem is to synthesize an approximation of f*M/P using hardware running on the f*N frequency clock. Here P is a small integer such that M/P<N. For example if f=1 Hz, N=1000, M=1007 and P=4, a 1007/4 (f*M/P)=251.75 Hz approximation is synthesized from the 1000 Hz (f*N) source as follows. On every 1000 Hz clock an accumulator is incremented by 1007. If the result is positive, the accumulator is decremented by P*N=4000 and an output pulse is generated. The 1007 Hz (f*M) clock is divided by 4 and used to lock the 251.75 Hz approximation just generated. With a slow enough loop filter, this gives the desired results. However the phase noise of the 251.75 Hz approximation has significant low frequency energy requiring the slow loop response.

Another prior art method for addressing this loop bandwidth problem is to synthesize a sine wave of frequency f*/MP using hardware running on the f*N frequency clock. In this case P is such that M/P<N/2. The sine wave is synthesized using a read only memory (ROM) look-up table on the upper (or all) bits of a first (only) accumulator, followed by a digital to analog converter and a narrow band pass filter at the frequency f*/MP. The sine wave is squared up and used in a phase comparator as in the above prior art method. This method allows a fast loop response, but requires more analog parts and the phase alignment is very sensitive to the accuracy of the band pass filter components.

Yet another prior art method for addressing the loop bandwidth problem described above is accomplished through the implementation of a Sigma-Delta Fractional-N Synthesizer. An example of such a Sigma-Delta Fractional-N Synthesizer is depicted in U.S. Pat. No. 5,517,534 issued May 14, 1996 to David L. Knierim entitled "Phase locked loop with reduced phase noise", which is incorporated herein by reference in its entirety. In the Knierim Patent an accumulator-based phase locked loop uses one or more additional accumulators to reduce phase noise by shifting the energy of the phase noise to higher frequencies, beyond the bandwidth of a loop filter. Such a system, however, is limited in speed because the entire circuit must operate at the full velocity of an included VCO.

SUMMARY OF INVENTION

These and other deficiencies of the prior art are addressed by the present invention. Specifically, in an embodiment of the invention only a simple programmable pre-scaler operates at the full VCO frequency and the Sigma-Delta accumulators operate at a slower reference frequency. In a sigma-delta modulator according to the present invention a sequence of integers are produced that represent the time between consecutive pulses from the pulse generator and this sequence is used to control a pre-scaler clocked by the VCO, in order to produce the same sequence of pulses, with a greatly reduced complexity of high-speed circuitry.

In one embodiment of the present invention a method for reducing phase noise includes clocking a programmable pre-scaler using the frequency output of a voltage controlled oscillator, dividing the frequency output of the voltage controlled oscillator using a divide ratio sequence in the pre-scaler to form an approximation frequency that is on average substantially equal to a reference signal, comparing the phases of the approximation frequency and the reference signal, and in response to a difference in phase between the approximation frequency and the reference signal, generating a control signal to adjust the frequency output of the voltage controlled oscillator to correct for the difference. As such, only the pre-scaler is required to operate at the full frequency of the voltage controlled oscillator. In the present invention, a novel modulator provides the divide ratio sequence to the pre-scaler to be used for dividing the frequency output of the voltage controlled oscillator. The modulator of the present invention includes at least a first accumulator, a second accumulator and a feedback circuit for feeding back an accumulated error to the first accumulator, wherein a next value in said sequence of divide ratios is determined such that the multiply-accumulated error values are maintained within finite bounds.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF THE INVENTION

Figure 1:
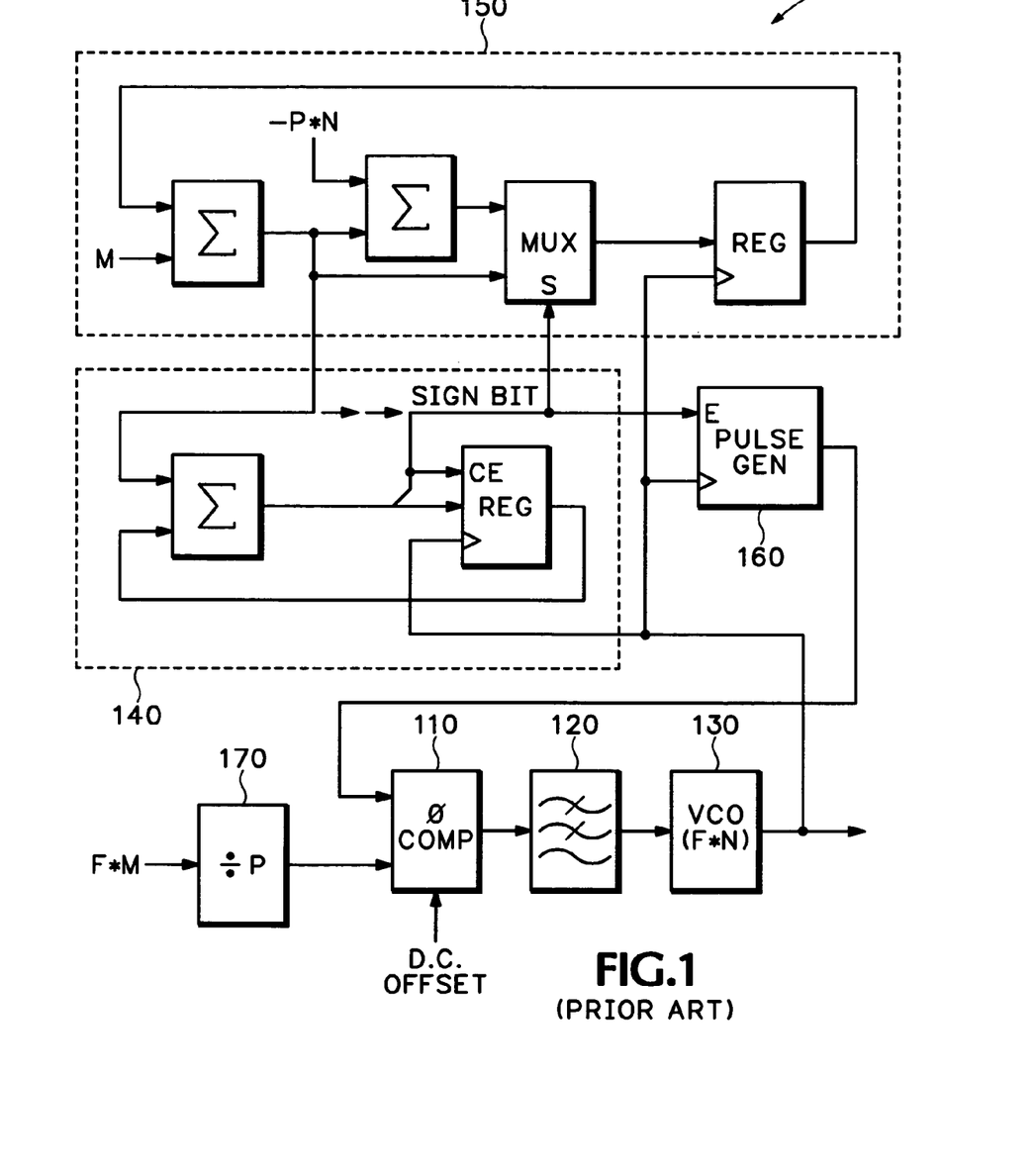
FIG. 1 depicts a high level block diagram of a prior art Sigma-Delta Fractional-N Synthesizer.

FIG. 1 depicts a high level block diagram of a prior art Sigma-Delta Fractional-N Synthesizer. An example of such a Sigma-Delta Fractional-N Synthesizer is depicted in U.S. Pat. No. 5,517,534 issued May 14, 1996 to David L. Knierim entitled "Phase locked loop with reduced phase noise", which is incorporated herein by reference in its entirety. In the prior art Sigma-Delta Fractional-N Synthesizer of FIG. 1, the output of a phase comparator 110 is input to a lowpass loop filter 120, the output of which provides a control voltage for a voltage controlled oscillator (VCO) 130 having an output signal at frequency f*N. The phase locked loop 100 of FIG. 1 reduces phase noise by shifting the energy of the phase noise to higher frequencies. The accumulator-based phase locked loop 100 generates an approximation frequency from a clock signal generated by the VCO 130. The approximation frequency is phase compared with a comparable frequency derived from a reference signal to generate an error control signal. The error control signal is used to control the frequency of the clock signal. A second accumulator circuit 140 is inserted between a first accumulator circuit 150 of the phase locked loop 100 and a pulse generator 160 from which the approximation frequency is obtained to integrate the phase error from the first accumulator circuit 150. The integration serves to shape the phase noise so that the energy is moved to higher frequencies. However, as previously noted, the prior art Sigma-Delta Fractional-N Synthesizer of FIG. 1 is limited in speed because the entire circuit must operate at the full velocity of the VCO 130.

The inventors propose herein an improvement to Phase locked loop Sigma-Delta Fractional-N Synthesizers, such as the phase locked loop 100 of FIG. 1, by, in part, selecting a reference frequency at least several times lower than the frequency of an included VCO and through the implementation of a novel modulator providing a divide ratio to a pre-scaler to be used for the dividing of the frequency output of the VCO. The selected frequency enables the setting of an integer divisor of a divider circuit to be set to P=1, eliminating the need in a phase locked loop of the present invention for a ÷P circuit, such as the ÷P circuit 170 implemented in the prior art Sigma-Delta Fractional-N Synthesizer of FIG. 1. In addition, the novel modulator design of the present invention does not have to progress through intermediate states between the output pulses of the approximation frequency.

Figure 2:
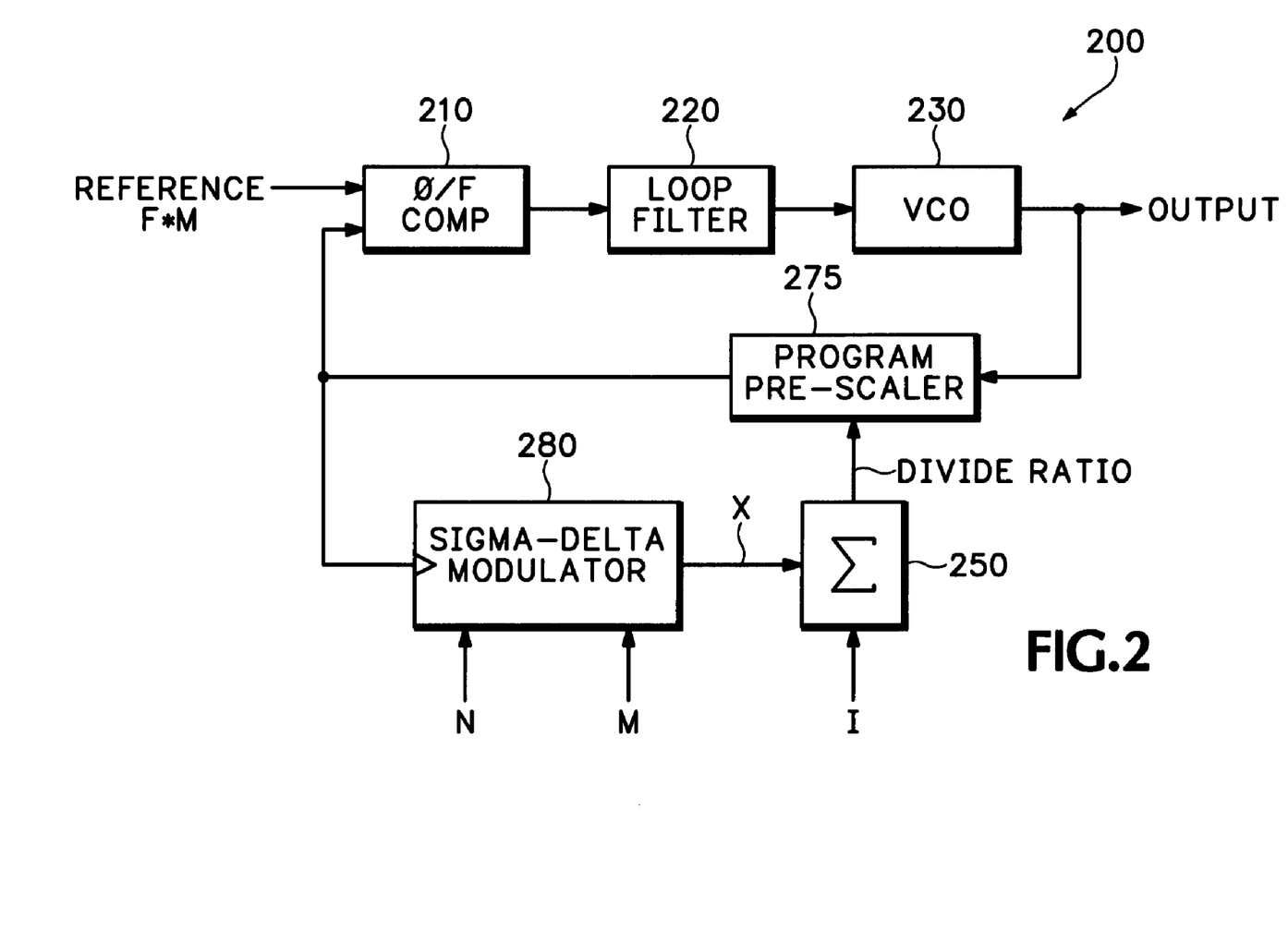
FIG. 2 depicts a high level block diagram of an embodiment of an improved Sigma-Delta Fractional-N Synthesizer in accordance with the present invention.

FIG. 2 depicts a high level block diagram of an embodiment of an improved Sigma-Delta Fractional-N Synthesizer in accordance with the present invention. The Sigma-Delta Fractional-N Synthesizer 200 of FIG. 2 comprises a phase comparator 210, a loop filter 220, a VCO 230, a programmable pre-scaler 275, a sigma-delta modulator 280, and an optional summing circuit 250. Although in FIG. 2, the Sigma-Delta Fractional-N Synthesizer 200 is depicted as comprising a summing circuit 250, in alternate embodiments of the present invention, a Sigma-Delta Fractional-N Synthesizer in accordance with the present invention does not include a summing circuit and the output of an included sigma-delta modulator is communicated directly to an included pre-scaler.

In the Sigma-Delta Fractional-N Synthesizer 200 of FIG. 2, a reference frequency signal having a frequency, f*M, at least several times lower than the frequency of the VCO 230 provides one input to the phase comparator 210. A second input to the phase comparator 210 is provided by the output of the pre-scaler 275. The output of the phase comparator 210 is communicated to the loop filter 220. The output of the loop filter 220 provides a control voltage for the VCO 230 which has an output signal at frequency f*N. A portion of the output of the VCO 230 provides one input to the programmable pre-scaler 275 and is used to clock the programmable pre-scaler 275. The summing circuit 250 provides a second input to the programmable pre-scaler 275. The output of the programmable pre-scaler 275 provides feedback pulses to a second input of the phase comparator 210 (as previously mentioned) and provides a clock signal to the sigma-delta modulator 280. The output of the sigma-delta modulator 280 provides an input to the summing circuit 250, whose output is communicated to a second input, a variable divide ratio input, of the programmable pre-scaler 275.

In operation, the VCO frequency, f*N, is divided by a sequence of integers, X, in the pre-scaler 275 to form an approximation frequency that is on average equal to the reference frequency, f*M. These two frequencies are compared in the phase comparator 210 to produce an error signal. This error signal is filtered by the loop filter 220 to remove high-frequency phase noise, and then used to adjust the output frequency of the VCO 230 to ensure that it remains at f*N.

The integer sequence, X, is fed to the pre-scaler 275 from the Sigma-Delta Modulator 280 and has an average value of N/M. In the Sigma-Delta Modulator 280 a first accumulator accumulates an error between the integer sequence, X, and the average value, N/M. Additional accumulators in the Sigma-Delta Modulator 280 accumulate the error outputs of directly previous accumulators and a feedback circuit provides a next value in the integer sequence, X. More specifically, the accumulators within the Sigma-Delta Modulator 280 accumulate the sequence N−X*M and feedback within the Modulator 280 keeps the multiply-accumulated sequence finite. That is, the feedback circuit provides a next value in the sequence, X, to the first accumulator that serves to at least partially cancel previously accumulated errors, and thus keep the accumulated error values within finite bounds. The very large gain of the accumulators at low frequency requires a very small amount of phase error in the sequence N−X*M at low frequency. The low phase-noise content at low frequencies allows for use of a higher loop bandwidth, providing faster settling time to frequency changes and better rejection of phase noise within the VCO 230.

Rather than clocking the rest of the circuit with the VCO 230 as in the prior art Sigma-Delta Fractional-N Synthesizer of FIG. 1, in accordance with the present invention a programmable pre-scaler is inserted between the VCO and the sigma-delta modulator to provide a clock signal to the rest of the circuit and as such, only the pre-scaler of the present invention has to progress through intermediate states between output pulses.

For large values of the ratio N/M (e.g., N/M>15), the sequence X must be represented with many bits (e.g. >4 bits). As an optional simplification to the Sigma-Delta Modulator 280, the value of N provided to the Modulator may be reduced by M*I, which will reduce the average value of the sequence X by I. This is offset by using the summing circuit 250 to add I to the sequence X, so that the average divide ratio provided to the pre-scaler remains unchanged. The integer I is chosen to be close to N/M, so that the sequence X remains close to zero, and may be represented in the Modulator with only a few (e.g. ≦4) bits.

Figure 3:
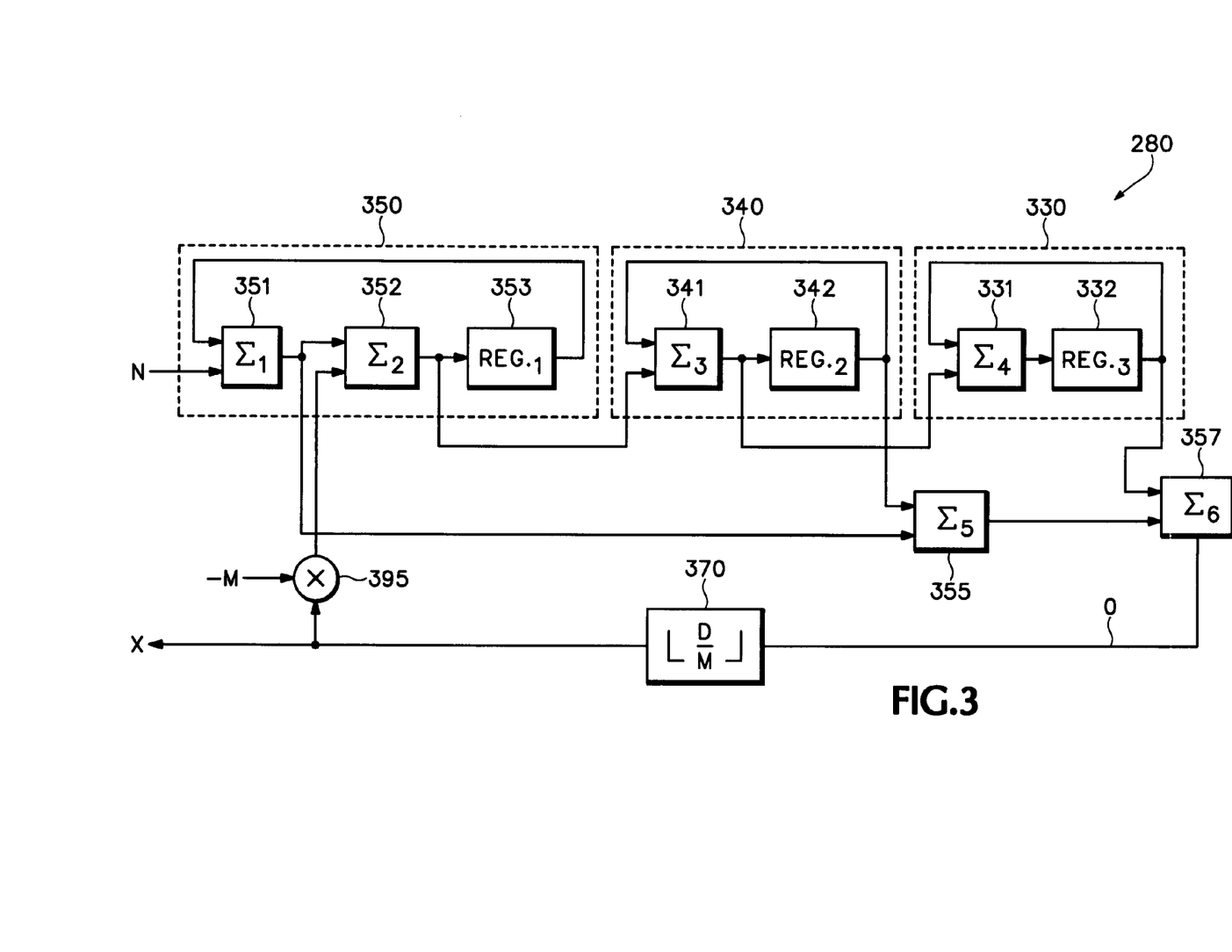
FIG. 3 depicts a high level block diagram of an embodiment of a sigma-delta modulator suitable for use in the Sigma-Delta Fractional-N Synthesizer of FIG. 2.

FIG. 3 depicts a high level block diagram of an embodiment of a sigma-delta modulator suitable for use in the Sigma-Delta Fractional-N Synthesizer 200 of FIG. 2. The sigma-delta modulator 280 of FIG. 3 illustratively comprises a first accumulator 350 comprising a first summing circuit 351 with a programmable integer N as one input. The output of the first summing circuit 351 provides one input to a second summing circuit 352, the other input to the second summing circuit 352 being an integer –M*X from a multiplier circuit 395. The output of the second summing circuit 352 is communicated to a first register 353 and to a second accumulator 340. The output of the first register 353 is communicated as a second input to the first summing circuit 351.

The second accumulator 340 illustratively comprises a third summing circuit 341. The output of the second summing circuit 352 of the first accumulator 350 provides a first input to the third summing circuit 341. The output of the third summing circuit 341 in the second accumulator 340 is communicated to a second register 342 and to a fourth summing circuit 331 located in a third accumulator 330. The output of the second register 342 is communicated as a second input to the third summing circuit 341 located in the second accumulator 340.

The third accumulator 330 illustratively comprises the fourth summing circuit 331. The output of the third summing circuit 341 of the second accumulator 340 provides a first input to the fourth summing circuit 331. The output of the fourth summing circuit 331 is communicated to a third register 332 located within the third accumulator 330. The output of the third register 332 is communicated as a second input to the fourth summing circuit 331.

A fifth summing circuit 355 has as its inputs, the output of the first summing circuit 351 and the output of the second register 342. The output of the fifth summing circuit 355 is communicated as a first input to a sixth summing circuit 357. The sixth summing circuit 357 has as its second input, the output of the third register 332 located within the third accumulator 330. The output of the sixth summing circuit 357 is communicated to a divider circuit 370. A portion of the output of the divider circuit 370 is communicated to the multiplier circuit 395 which, as previously stated, provides an integer –M*X as the second input to the second summing circuit 352. Although in FIG. 3 the integer inputs to the sigma-delta modulator 280 are illustratively depicted as N and –M, the signs of both M and N may be inverted and continue to perform the aspects of the present invention.

In operation, the next value in the sequence N–X*M is added to the numeric content of register 353 within accumulator 350 on each clock pulse output by the pre-scaler 275. Accumulators have the property of gain being inversely proportional to input frequency. Thus a constant (zero frequency) error in the value of the sequence N–X*M would keep adding up forever, reaching infinite gain. Low frequency errors will accumulate for a long time, reaching relatively large gains, before the polarity of the error reverses and the accumulator value starts decreasing. High frequency errors, however, will not accumulate far before a polarity reversal reduces them again.

In a similar fashion, the sequence of values within accumulator 350 is accumulated by the second accumulator 340, and the sequence of values within the second accumulator 340 is accumulated by the third accumulator 330. Thus any low frequency components within the sequence N–X*M will have a huge gain at the output of the third accumulator 330.

The feedback loop comprising the summing circuits 355 and 357 and the divider circuit 370 serves to predict the appropriate next-value of the sequence X in order to keep the output of the accumulators finite and without overflow. This is equivalent to predicting the number of VCO clock cycles that would be required in the Phase-Locked Loop in FIG. 1 to produce the next output pulse from the pulse generator 160 (and hence the number of times M is added to the first accumulator before subtracting N).

Multiplier 395 serves to calculate X times –M and provides the result in parallel to the first accumulator 350. In contrast, the first accumulator 150 in prior art FIG. 1 operatively adds M to the accumulated value, X times in a row. This serial form of multiplication of the prior art requires clocking the accumulator at the VCO frequency, thus limiting the speed of the prior art design.

Figure 4:
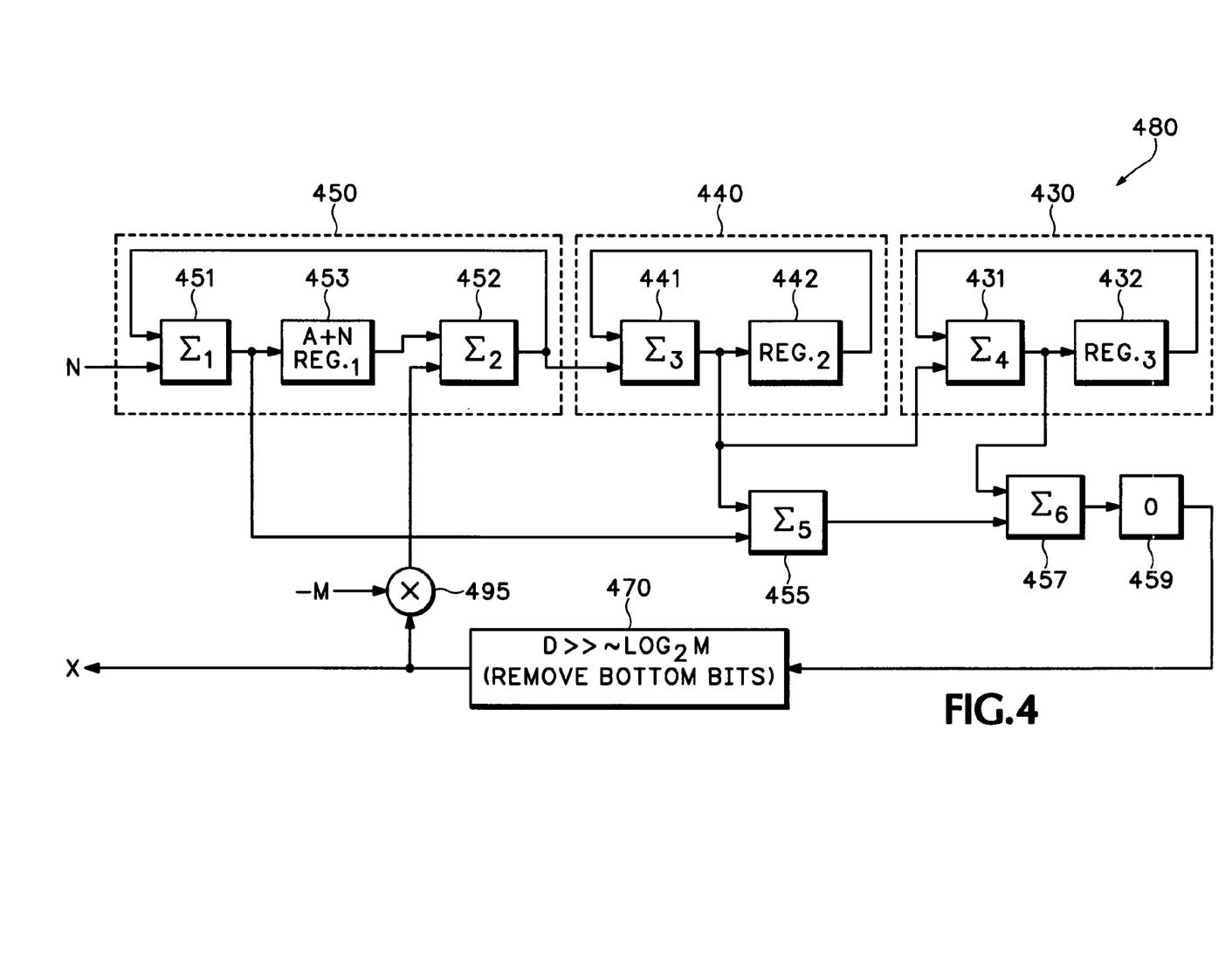
FIG. 4 depicts a high level block diagram of an alternate embodiment of a sigma-delta modulator suitable for use in the Sigma-Delta Fractional-N Synthesizer of FIG. 2.

In an alternate embodiment of the present invention, a sigma-delta modulator is further adapted to calculate, in advance and in parallel, the input to the divider circuit. In addition, numerical approximations may be made in calculating X, so long as the feedback loop around the accumulators remains stable. Zero DC error and very small low-frequency phase error is guaranteed by accumulating a sequence of X's selected, so long as the sequence in the final accumulator remains within pre-determined bounds. FIG. 4 depicts a high level block diagram of an alternate embodiment of a sigma-delta modulator 480 suitable for use in the Sigma-Delta Fractional-N Synthesizer 200 of FIG. 2. The sigma-delta modulator 480 of FIG. 4 comprises substantially the same components and configuration as the sigma-delta modulator 280 of FIG. 3 with the exception of the relocation of the first register 453 of the first accumulator 450, the inputs to the summing circuits 455 and 457, and the inclusion of an additional register 459.

The sigma-delta modulator 480 of FIG. 4 illustratively comprises a first accumulator 450 comprising a first summing circuit 451 with a fixed integer N as one input. The output of the first summing circuit 451 provides an input to a first register 453. The output of the register 453 is communicated as a first input to a second summing circuit 452. A second input to the second summing circuit 452 is an integer –M*X from a multiplier circuit 495. The output of the second summing circuit 452 is communicated as a second input to the first summing circuit 451 and to a second accumulator 440. The second accumulator 440 illustratively comprises a third summing circuit 441. The output of the second summing circuit 452 of the first accumulator 450 provides a first input to the third summing circuit 441 located within the second accumulator 440. The output of the third summing circuit 441 is communicated to a second register 442 and to a third accumulator 430. The output of the second register 442 is communicated as a second input to the third summing circuit 441 located within the second accumulator 440. The third accumulator 430 illustratively comprises a fourth summing circuit 431. The output of the third summing circuit 441 of the second accumulator 440 provides a first input to the fourth summing circuit 431. The output of the fourth summing circuit 431 is communicated to a third register 432 located within the third accumulator 430. The output of the third register 432 is communicated as a second input to the fourth summing circuit 431.

A fifth summing circuit 455 has as its inputs, the output of the first summing circuit 451 located within the first accumulator 450 and the output of the third summing circuit 441 located within the second accumulator 440. The output of the fifth summing circuit 455 is communicated as a first input to a sixth summing circuit 457. The sixth summing circuit 457 has as its second input, the output of the fourth summing circuit 431 of the third accumulator 430. The output of the sixth summing circuit 457 is communicated to a fourth register 459. The output of the register 459 is communicated to a divider circuit 470. A portion of the output of the divider circuit 470 is communicated to the multiplier circuit 495 which, as previously stated, provides an integer −M*X as the second input to the second summing circuit 452 of the first accumulator 450.

The operation of the sigma-delta modulator 400 of FIG. 4 is substantially the same as the operation of the sigma-delta modulator 280 of FIG. 3 with the following exceptions:

1) Register 453 is placed between the first summing circuit 451 and the second summing circuit 452 rather then after the second summing circuit 352 as in the sigma-delta modulator 280 of FIG. 3. This makes the contents of register 453 equivalent to the contents of the first register 353 of the sigma-delta modulator 280 of FIG. 3+N. It also delays the effect of any change in the programming of the value N by one clock cycle, but this effect is benign.

2) The inputs to the summer comprising summing circuits 455 and 457 have been moved from the outputs to the inputs of registers 452, 442, and 432, and the output of the sixth summer 457 has been connected to a new register 459.

3) The divider circuit 470 is greatly simplified by allowing it to divide by a fixed power of 2 close to M rather than do a full integer divide. This still retains the flexibility of programming any value for M. The fixed power of two is chosen larger than the largest desired M, and for smaller values of M, the modulator is programmed with N*K and M*K, where K is an integer chosen such that M*K is close to the fixed power of 2.

In the modulator 280 of FIG. 3, the minimum clock period is limited by the time for the summing circuits' carry chains to propagate up the full width of the data busses, followed by the propagation delay of the divider and multiplier, followed by another carry chain propagation, as the multiply operation can cause a Least-Significant Bit to change after a transition in the value of X. In contrast, the changes in topology 1) and 2) above, of modulator 480 allow the divide and multiply to happen at the beginning of the clock period, and then allow all summing circuits' carry chains to propagate from LSB to MSB just once. In addition, the simplified divider 470 has no propagation delay at all, because a divide by a fixed power of 2 can be implemented by shifting and truncating bits within the data bus. Thus the modulator 480 can be clocked at a much higher rate than the modulator 280 of FIG. 3.

Figure 5:
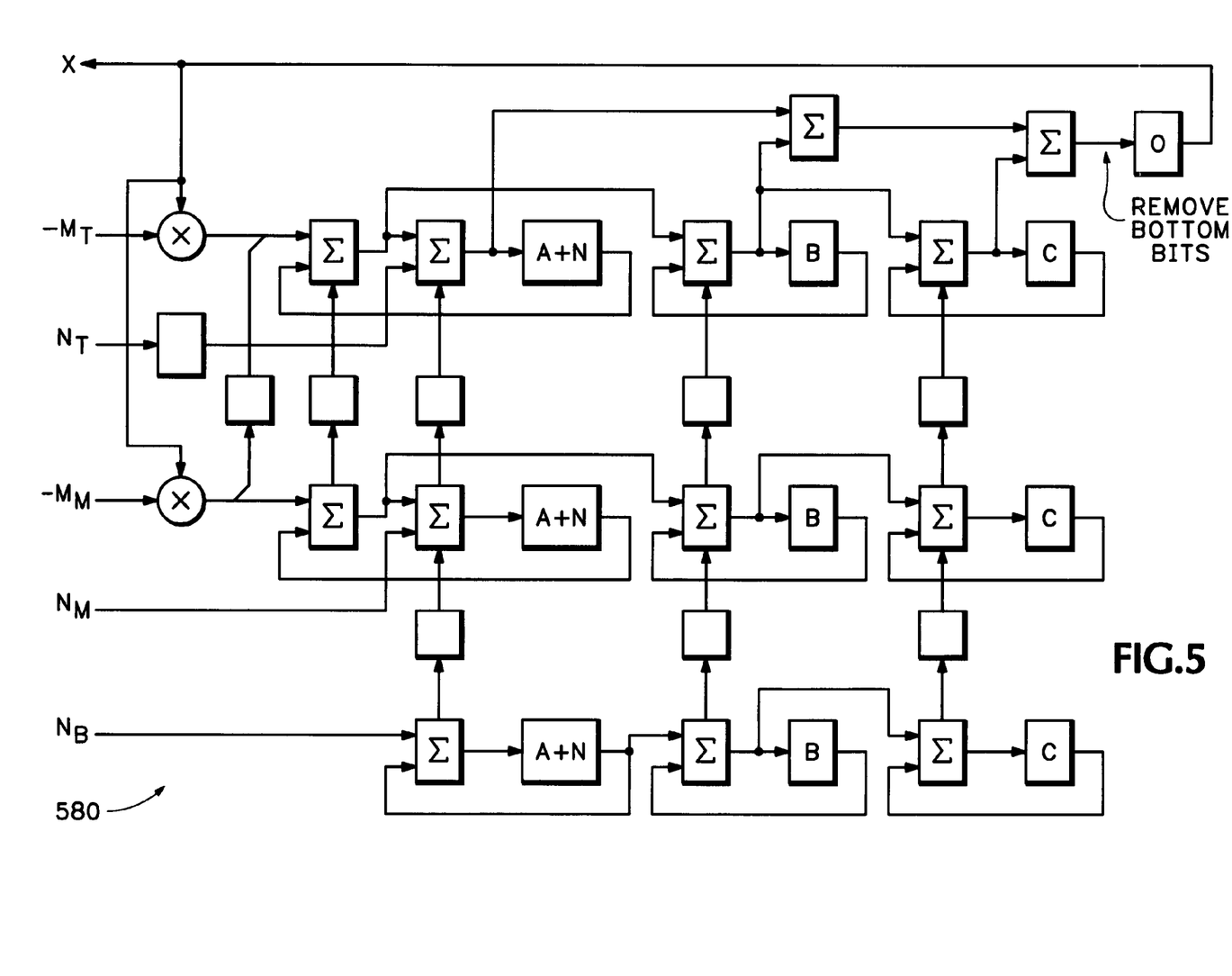
FIG. 5 depicts a high level block diagram of an alternate embodiment of the sigma-delta modulator of FIG. 4.

FIG. 5 depicts a high level block diagram of an alternate embodiment of the sigma-delta modulator 480 of FIG. 4, further adapted to pipeline carry chains in the adder circuits. The sigma-delta modulator 580 of FIG. 5 is further adapted to accommodate the split of M into $M_T$ and $M_M$, where $M_T >> M_M$, and wherein the addition of $-M_M*X$ to a first accumulator may be delayed by one cycle to, for example, allow a pipeline stage in the carry chain between the bits used to represent $M_T$ and $M_M$. The sigma-delta modulator 580 of FIG. 5 illustratively comprises substantially similar components as the sigma-delta modulator 480 of FIG. 4 with the following exceptions:

1) The summing circuits and registers are split into three parts (Top, ($_T$), Middle, ($_M$), Bottom, ($_B$)) to reduce the length of the carry chains in each part, and the carry chains are pipelined (connected through 1-bit registers) between the parts. This allows even faster operation of the modulator.

2) Summing circuits equivalent to 455 and 457 have been deleted in the Middle and Bottom parts to save cost (this is a very minor additional approximation in the divide—only the carry out of the lower parts would have been used anyway).

M has been split into $M_T$ and $M_M$ and the overflow of $-M_M*X$ above the bit range of the middle part delayed by a pipeline stage before being combined with the top part in order to mimic the delay in the pipelined carry chains.

While the foregoing is directed to various embodiments of the present invention, other and further embodiments of the invention may be devised without departing from the basic scope thereof, and the scope thereof is determined by the claims that follow.

What is claimed is:

1. A phase-locked loop-type frequency synthesizer comprising:
   a reference signal source for providing a reference signal having a first frequency;
   a programmable oscillator for providing an oscillating signal having a second frequency;
   a programmable pre-scaler for dividing the oscillating signal from said programmable oscillator according to a sequence of divide ratios to produce a divided signal having a frequency approximating the first frequency;
   a phase comparator for a) comparing said divided signal and said reference signal, b) determining, if any, a phase difference between said divided signal and said reference signal and c) generating a control signal for adapting said programmable oscillator to reduce a phase difference between said divided signal and said reference signal; and
   a modulator for providing said sequence of divide ratios wherein a next value in said sequence of divide ratios is provided by (a) accumulating an error between a present value in said sequence of divide ratios and an average value of said sequence of divide ratios, (b) accumulating the accumulated errors, and (c) selecting the next value in said sequence of divide ratios such that the multiply-accumulated error values are maintained within finite bounds, wherein said modulator comprises:
      a first accumulator for accumulating an error between a present value in said sequence of divide ratios and an average value of said sequence of divide ratios;
      a second accumulator for accumulating an error output of said first accumulator; and
      a feedback circuit having at least the error output from said first accumulator and an accumulated error output from said second accumulator as inputs for feeding back an accumulated error to the first accumulator for providing a next value in said sequence of divide ratios.

2. The synthesizer of claim 1, wherein said programmable oscillator comprises a voltage controlled oscillator.

3. The synthesizer of claim 1, further comprising a summing circuit interposed between said modulator output and an input to said pre-scaler for offsetting the sequence of divide ratios determined by said modulator, such that said sequence of divide ratios may contain values beyond those which may be represented in the modulator.

4. The synthesizer of claim 1, wherein only said pre-scaler is required to operate at the full frequency of said programmable oscillator.

5. The synthesizer of claim 1, wherein said pre-scaler provides a clock signal for the modulator.

6. The synthesizer of claim 1, wherein said modulator further comprises at least a third accumulator for accumulating a phase error output of a previous accumulator.

7. The synthesizer of claim 1, wherein the accumulators of said modulator comprise carry chains.

8. The synthesizer of claim 7, wherein at least a portion of the feedback circuit is delayed to allow for pipelining of said carry chains.

9. The synthesizer of claim 1, further comprising a filter for filtering said control signal to remove high-frequency phase noise prior to adapting said programmable oscillator.

10. The synthesizer of claim 9, wherein said filter comprises a loop filter.

11. The synthesizer of claim 1, wherein said feedback circuit further comprises at least one summing circuit and a numeric divider circuit adapted to determine a next value in the sequence of divide ratios needed to maintain said accumulators finite and without overflow.

12. The synthesizer of claim 11 wherein said numeric divider circuit produces an approximation of an ideal quotient.

13. The synthesizer of claim 1, wherein said reference frequency has a frequency equal to f*M and said programmable oscillator has a frequency equal to f*N and the sequence of divide ratios comprises an integer sequence having an average value substantially equal to N/M.

14. The synthesizer of claim 13, wherein both N and M are programmable.

15. The synthesizer of claim 14, wherein N and M may be reprogrammed during operation.

16. A method, comprising:
dividing an oscillating signal having a first frequency according to a sequence of at least three distinct divide ratios to produce a divided signal having a frequency approximating a reference signal frequency; and
adapting said first frequency to reduce a phase difference between said divided signal and said reference signal;
wherein a next value in said sequence of divide ratios is determined by (a) accumulating an error between a present value in said sequence of divide ratios and an average value of said sequence of divide ratios, (b) accumulating the accumulated errors, and (c) selecting the next value in said sequence of divide ratios such that the multiply-accumulated error is maintained within finite bounds.

17. The method of claim 16, further comprising filtering a control signal to remove high-frequency phase noise prior to using said control signal for adapting said first frequency to reduce a phase difference between said divided signal and said reference signal.

18. The method of claim 16, wherein the multiply-accumulated error is fed back to a first means of at least two means for accumulating.

19. A modulator for producing an integer sequence with an average value of N/M, wherein N and M are integers, comprising:
a first accumulator for accumulating an error between said integer sequence and said average value, N/M;
a second accumulator for accumulating an error output of said first accumulator; and
a feedback circuit having at least the error output from said first accumulator and an accumulated error output from said second accumulator as inputs for feeding back an accumulated error to the first accumulator for providing a next value in said integer sequence such that the multiply-accumulated error values are maintained within finite bounds.

20. The modulator of claim 19, further comprising at least a third accumulator for accumulating an error output of a previous accumulator.

21. The modulator of claim 19, wherein both N and M are programmable.

22. The modulator of claim 21, wherein N and M may be programmed during operation.

23. The modulator of claim 19, wherein said accumulators of said modulator comprise carry chains.

24. The modulator of claim 23, wherein at least a portion of the feedback circuit is delayed to allow for pipelining of said carry chains.

25. The modulator of claim 19, wherein said feedback circuit further comprises at least one summing circuit and a numeric divider circuit adapted to determine a next value in said integer sequence needed to maintain said accumulators finite and without overflow.

26. The modulator of claim 25 wherein said numeric divider circuit produces an approximation of an ideal quotient.

27. A method for reducing phase noise, comprising:
clocking a programmable pre-scaler using the frequency output of a voltage controlled oscillator;
dividing the frequency output of said voltage controlled oscillator in said pre-scaler using a divide ratio sequence from a modulator to form an approximation frequency that is on average substantially equal to a reference signal, said divide ratio sequence having an average value substantially equal to N/M, wherein N and M are integers;
comparing the phases of said approximation frequency and said reference signal; and
in response to a difference in phase between said approximation frequency and said reference signal, generating a control signal to adjust the frequency output of said voltage controlled oscillator to correct for the difference;
wherein only said pre-scaler is required to operate at the full frequency of said voltage controlled oscillator; and
wherein the modulator provides the divide ratio sequence to said pre-scaler to be used for the dividing of the frequency output of said voltage controlled oscillator according to the steps of:
accumulating an error between said divide ratio sequence and said average value, N/M in a first accumulator;
accumulating an error output of said first accumulator in a second accumulator; and
feeding back an accumulated error from the outputs of the first and second accumulators to the first accumulator for providing a next value in said sequence of divide ratios such that the multiply-accumulated error values are maintained within finite bounds.

* * * * *